United States Patent [19]
Shibata et al.

[11] Patent Number: 5,897,982
[45] Date of Patent: *Apr. 27, 1999

[54] RESIST DEVELOP PROCESS HAVING A POST DEVELOP DISPENSE STEP

[75] Inventors: Tsuyoshi Shibata, Fishkill; Eric A. Lehner, Wappinger Falls, both of N.Y.

[73] Assignee: Kabushiki Kaisha Toshiba, Kanagawa-ken, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/610,981

[22] Filed: Mar. 5, 1996

[51] Int. Cl.$^6$ .................................................. G03F 7/30
[52] U.S. Cl. .............................................................. 430/311
[58] Field of Search .................................. 430/311, 329, 430/331

[56] References Cited

U.S. PATENT DOCUMENTS

| | | |
|---|---|---|
| 3,930,857 | 1/1976 | Bendz et al. . |
| 4,564,280 | 1/1986 | Fukuda ..................................... 354/317 |
| 4,587,203 | 5/1986 | Brault et al. ............................. 430/325 |
| 4,690,880 | 9/1987 | Suzuki et al. ............................. 430/313 |
| 4,786,578 | 11/1988 | Neisius et al. ............................ 430/256 |
| 4,902,608 | 2/1990 | Lamb et al. .............................. 430/325 |
| 5,292,605 | 3/1994 | Thomson ................................... 430/30 |
| 5,342,738 | 8/1994 | Ikeda ........................................ 430/325 |
| 5,451,480 | 9/1995 | Novembre ................................. 430/30 |

FOREIGN PATENT DOCUMENTS

| | | |
|---|---|---|
| 06045244 | 2/1994 | Japan . |
| 08044075 | 2/1996 | Japan . |
| 2 166 254 | 4/1986 | United Kingdom . |
| WO 91/18322 | 11/1991 | WIPO . |

*Primary Examiner*—Kathleen Duda
*Attorney, Agent, or Firm*—Banner & Witcoff, Ltd.

[57] ABSTRACT

A resist develop process involves the steps of dispensing a developer on a resist on a semiconductor wafer, forming the developer into a puddle where a portion of the resist dissolves into the developer, dispensing additional developer following development, rinsing the wafer with a rinsing agent, and drying the wafer surface. The additional developer dispense step replaces developer with resist dissolved therein with new developer prior to the rinsing step to prevent potential resist precipitation during the rinsing step which can lead to bridging.

21 Claims, 6 Drawing Sheets

RESIST DEVELOP PROCESS HAVING A POST DEVELOP DISPENSE STEP

FIELD OF INVENTION

The invention generally relates to a resist develop process and, more particularly, to a resist develop process which utilizes a post develop dispense (PDD) step.

BACKGROUND OF INVENTION

Photolithography employing a resist film is applied to fabricating electronic devices, such as semiconductor devices. A substrate is coated with a layer of resist material to form a photoresist thereon. The layer of resist material typically comprises a polymer with additives, such as radiation sensitizers, plasticizers, and adhesion promoters. The substrate can be a semiconductor wafer from which integrated circuit chips are formed or a module used to support and interconnect semiconductor integrated circuit chips.

The resist layer is exposed patternwise to electromagnetic radiation to change the solubility of portions of the resist layer. The resist layer is developed with solvents which remove the soluble portions of the resist layer leaving the substantially insoluble portions and uncovering parts of the substrate for further processing. The substrate is then typically subjected to etching or deposition processes.

There are two general types of resists, positive and negative. During the exposure step, the areas on a negative resist exposed to light undergo polymerization and change from being soluble to being substantially insoluble. In contrast, areas on a positive resist exposed to light undergo photosolubilization and change from being substantially insoluble to soluble. Positive resists are the resists of choice for fabrication area processing of state-of-theart circuits because they have a better resolution capability than negative resists. Accordingly, positive resists can resolve smaller openings due to the smaller size of the polymers therein. However, there are many devices with image sizes greater than 5 μm for which negative resists can be used.

After a wafer has been aligned and exposed, it is subject to a development process. During the development process, an exposed photoresist film having the predetermined pattern is developed with a developer to remove resist film to form a predetermined pattern of photoresist film on the wafer. Referring to FIGS. 1a–1d. a conventional resist develop process consists of a developer dispense step (puddle forming step) as shown in FIG. 1a, a puddle develop step as shown in FIG. 1b, a water rinse step as shown in FIG. 1c, and a spin dry step as shown in FIG. 1d. As used herein, "puddling" refers to retaining a developer in a puddle by surface tension over the surface of a workpiece and "puddle develop" refers to a developing process using a developer puddle formed by puddling.

In developing an exposed resist film 1a formed on a semiconductor wafer 1, the wafer 1 is mounted on a vacuum wafer chuck 2 as shown in FIG. 1a. A developer 3 is spread in the developer dispense step by a nozzle 30 or the like over the surface of the resist film 1a to cover the surface of the wafer 1. The developer 3 is retained in a puddle by surface tension over the surface of the resist film 1a and the wafer 1 as shown in FIG. 1b.

After the puddle develop step, the wafer surface is rinsed with water as shown in FIG. 1c. In particular, the wafer chuck 2 holding the wafer 1 rotates while water 5 is dispensed from the nozzle 40. Immediately following the rinse step, the rotational speed of the wafer chuck 2 increases to a higher speed to dry the wafer 1 as shown in FIG. 1d. However, some of the resist which dissolves in the developer may precipitate during the water rinse step in water and harden and dry on the wafer surface because the resist is insoluble.

Consequently, a bridging problem often results since precipitant can stick to the wafer. Bridging is a condition where two patterns are connected by a thin layer of photoresist. Bridging can result from overexposure, a poor mask definition, or a resist film that is too thick. This type of defect has a substantial negative impact on the open/short yields for L/S (line/space) structures.

FIG. 2a shows an example of bridging which occurs when a positive resist and a clear (or light) field mask are used or when a negative resist and a dark field mask are used. The hatched regions in FIG. 2a represent a so-called "island", which are not removed during the develop process. The shaded regions represent precipitant which has bridged adjacent islands which causes short circuiting.

FIG. 2b shows an example of bridging which occurs when a positive resist and a dark field mask are used or when a negative resist and a clear field mask are used. The hatched regions in FIG. 2b represent a photomasking "hole" on the surface of the substrate. The shaded regions represent precipitant which has filled an area of a hole which can cause open circuits to form.

Resist bridging has generally taken place during prior art fabrication processes. However, other factors in the fabrication processes have tended to have a greater impact on product yield. As processing methods have improved and devices have become smaller and smaller, resist bridging has become an increasingly larger problem and an important consideration in determining how to increase yields. More particularly, with smaller devices resist bridging becomes a substantial contributor to reducing yield. Accordingly, there is a need in the art to substantially eliminate bridging which occurs in the resist develop process.

SUMMARY OF THE INVENTION

The present invention overcomes the aforementioned problem associated with conventional methods by employing a novel resist develop process. Specifically, a method according to the present invention involves a post development (PDD) step which is carried out between the puddle develop step and the rinse step. The PDD step replaces the developer containing amounts of resist with fresh developer before the water rinse step to prevent the possible precipitation of resist.

BRIEF DESCRIPTION OF THE DRAWINGS

The present invention will now be described in more detail with reference to preferred embodiments of the invention, given only by way of example, and illustrated in the accompanying drawings in which.

DETAILED DESCRIPTION

The present invention is discussed below with reference to a positive resist develop process, although the same principles can easily be applied to fabrication processes which employ negative resists. Also resists having various types of solvents, sensitizers, and additives can be used in the process according to the present invention such as chemically amplified resists. For purposes of this description, it is to be assumed that the polarity of the mask corresponds to that of a light field mask. It is to be understood that a similar process may be implemented with a dark field mask with alterations which are apparent to those skilled in the art.

Figure 1A:
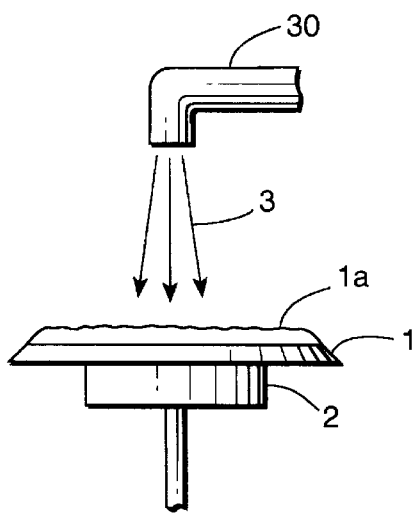
FIGS. 1a–1b shows the steps involved in a conventional resist develop process.
Figure 1B:
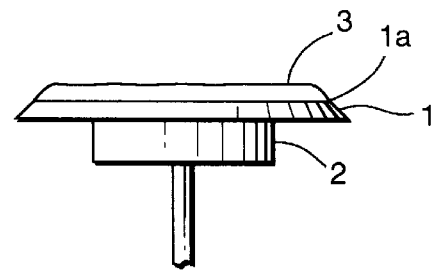
Figure 1C:
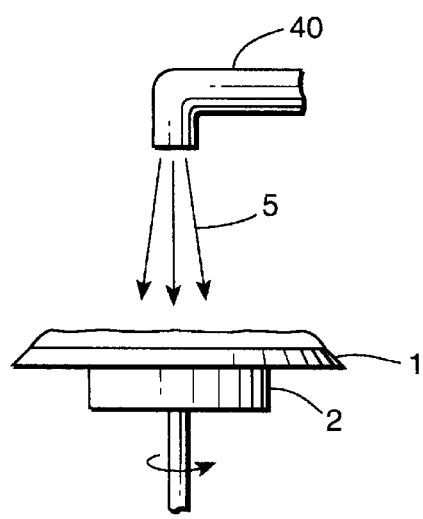
Figure 1D:
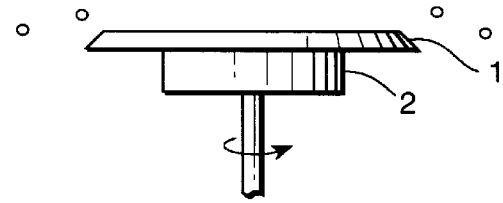
Figure 2A:
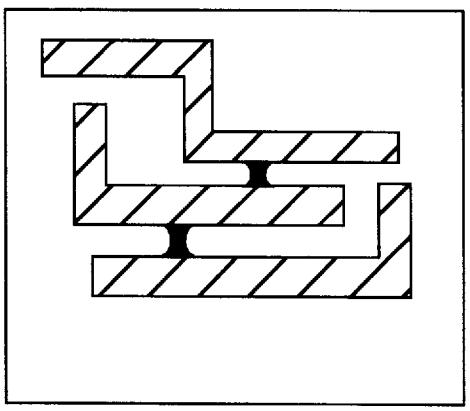
FIGS. 2a and 2b illustrate an exemplary bridging problems which can occur during conventional resist develop processes.
Figure 2B:
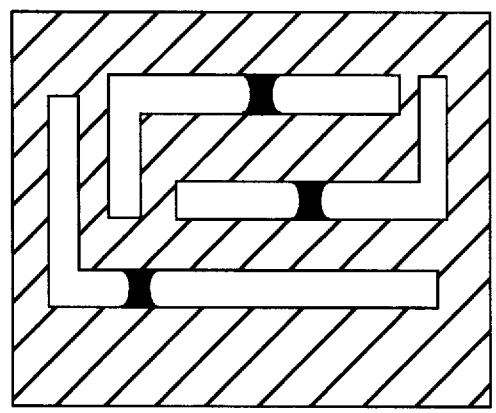
Figure 3A:
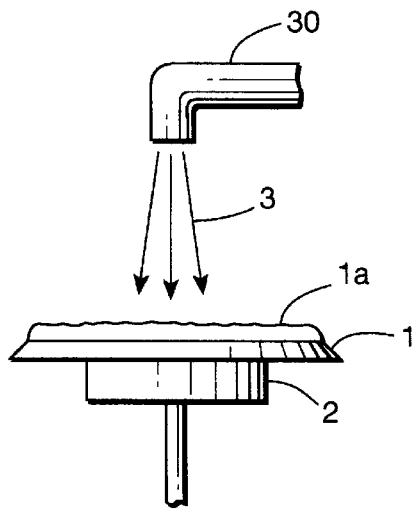
FIGS. 3a–3e illustrate an exemplary resist develop process according to the present invention.
Figure 3B:
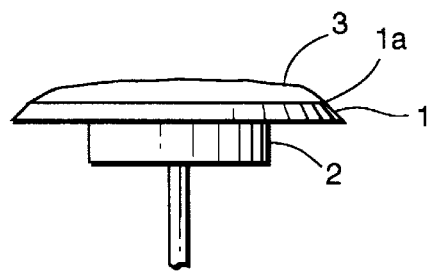
Figure 3C:
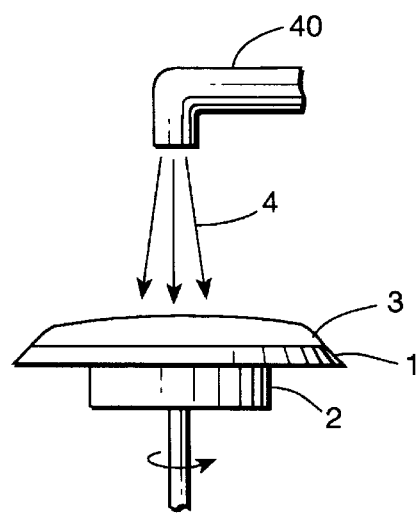
Figure 3D:
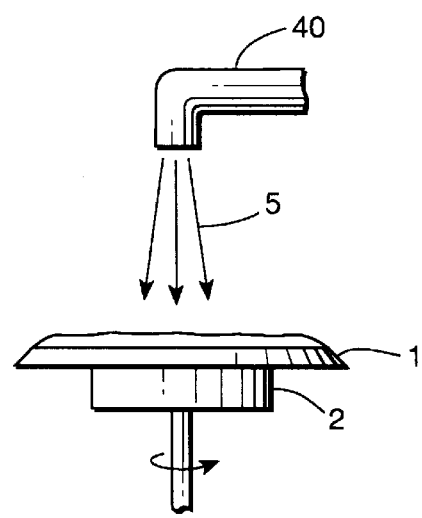
Figure 3E:
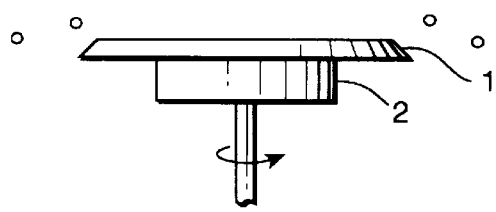
Figure 4:
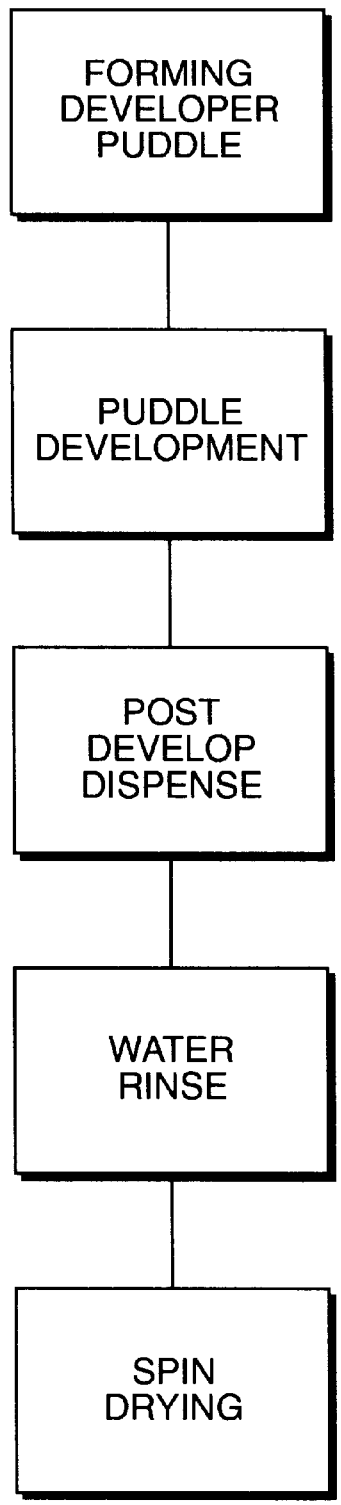
FIG. 4 shows a flow diagram representing the steps of an illustrative embodiment according to the present invention.

A resist develop process according to the present invention includes at least the following steps: 1) dispensing developer on a resist on a wafer to form a puddle as shown in FIG. 3a; 2) dissolving exposed portions of the positive resist in the developer during a puddle develop step as shown in FIG. 3b; and 3) after development, dispensing additional developer onto the resist on the wafer in a post develop dispense (PDD) as shown is FIG. 3c without forming another puddle. Thereafter, the surface of the wafer may be rinsed with deionized water as shown in FIG. 3d, and the surface of the wafer may undergo a spin dry step to dry the wafer as shown in FIG. 3e for further processing such as etching. A flow diagram showing the method of the present invention is shown in FIG. 4.

In the step of dispensing developer of FIG. 3a, a developer 3 is dispensed via a nozzle 30, forming a puddle in which the resist 1a, e.g., photoresist, is soluble. The unpolymerized or exposed portions of the resist 1a dissolve in the developer 3 which is typically a nonionic solution including TMAH, but may be any nonionic solution known in the art. In the puddle develop step, a puddle of developer 3 forms with all the exposed portions of the resist dissolved therein as shown in FIG. 3b. In this state, the wafer 1 is held stationary to develop the resist. The developer dispense step and puddle develop step may be carried out three or more times prior to the PDD step.

According to an alternative embodiment, a spin dry step, as shown in FIG. 3e may be inserted between the puddle develop step and the developer dispense step. Preferably, the puddle developer should not be completely spin dried to avoid having precipitant of the resist sticking to the wafer which can cause bridging.

Following the develop step, the PDD step replaces the original developer 3 with fresh developer 4 before the water rinse step as shown in FIG. 3c. With a positive resist, exposed portions of the resist dissolve in the developer 3 during development. By applying additional developer 4, original developer 3 containing the dissolved resist may be replaced. When a puddle has developed and resist dissolves into the developer 3 during the puddle develop step, the concentration of dissolved resist tends to form precipitant which precipitates during rinsing causing bridging. By introducing new developer in the PDD step, the concentration of dissolved resist is reduced and by spinning the wafer, the concentrated or loaded developer is removed. Thus, the PDD step prevents the resist from precipitating onto the surface of the semiconductor wafer 1 and forming bridges between the polymerized (i.e., unexposed) portions of resist on the wafer by replacing the original developer 3 quickly. The PDD step quickly replaces the resist containing developer used for puddle development with a fresh developer prior to rinsing. The idea is for the fresh developer to contain no resist during the subsequent deionized water rinse step, since the resist is insoluble in water.

During the PDD step, the additional developer 4 is dispensed from the nozzle 30 while the wafer chuck 2 spins. It is necessary to regulate the amount of developer 4 dispensed, the dispense time, and the rotating speed. For example, a sufficient level of developer absorption must occur, but not so much that another puddle develops. According to an illustrative embodiment, the additional developer 4 is dispensed during a period of less than or equal to five seconds onto an eight inch wafer 1, while the wafer chuck 2 rotates at a rate of at least 100 rpm to satisfy the aforementioned considerations. Preferably, an amount of approximately 25 milliliters of developer 4 is dispensed for about two seconds while the wafer chuck 2 spins at a rate of approximately 1000 rpm. The PDD time should not be so long as to cause chemical deposition uniformity to worsen or to consume unnecessary quantities of developer.

The developer 4 added during PDD does not have to be the exact same developer used in the developer dispense and puddle develop steps. The only requirement is that the additional developer 4 be compatible with both the water and the resist. For example, the TMAH used in the PDD step may have a higher or lower normality than the developer used in the puddle develop step. Also, the additional developer 4 may contain more or less surfactant than the developer used in the puddle develop step. The choice of what substance to use for the additional developer 4 is based on the desired characteristics of the developer.

Following the PDD step, the wafer 1 is rinsed with a deionized water rinse 5 dispensed from the nozzle 40 while the wafer chuck 2 rotates the wafer 1 as shown in FIG. 3d. According to an illustrative embodiment, the PDD step and water rinse step may be carried out in a simultaneous manner. The only caveat is that the dispensing of the additional developer 4 must start earlier than the water rinse step.

Typically, different dispense nozzles are used for the PDD step and water rinse step. The dispense nozzle may be any type known in the art such as a stream or spray type. However, spray nozzles tend to create bubbles in the developer during dispensing.

Following the water rinse step, the wafer chuck 2 can be rotated at an appropriate speed to spin dry the wafer as shown in FIG. 3e. Thereafter, additional processing as desired may be carried out.

Figure 5:
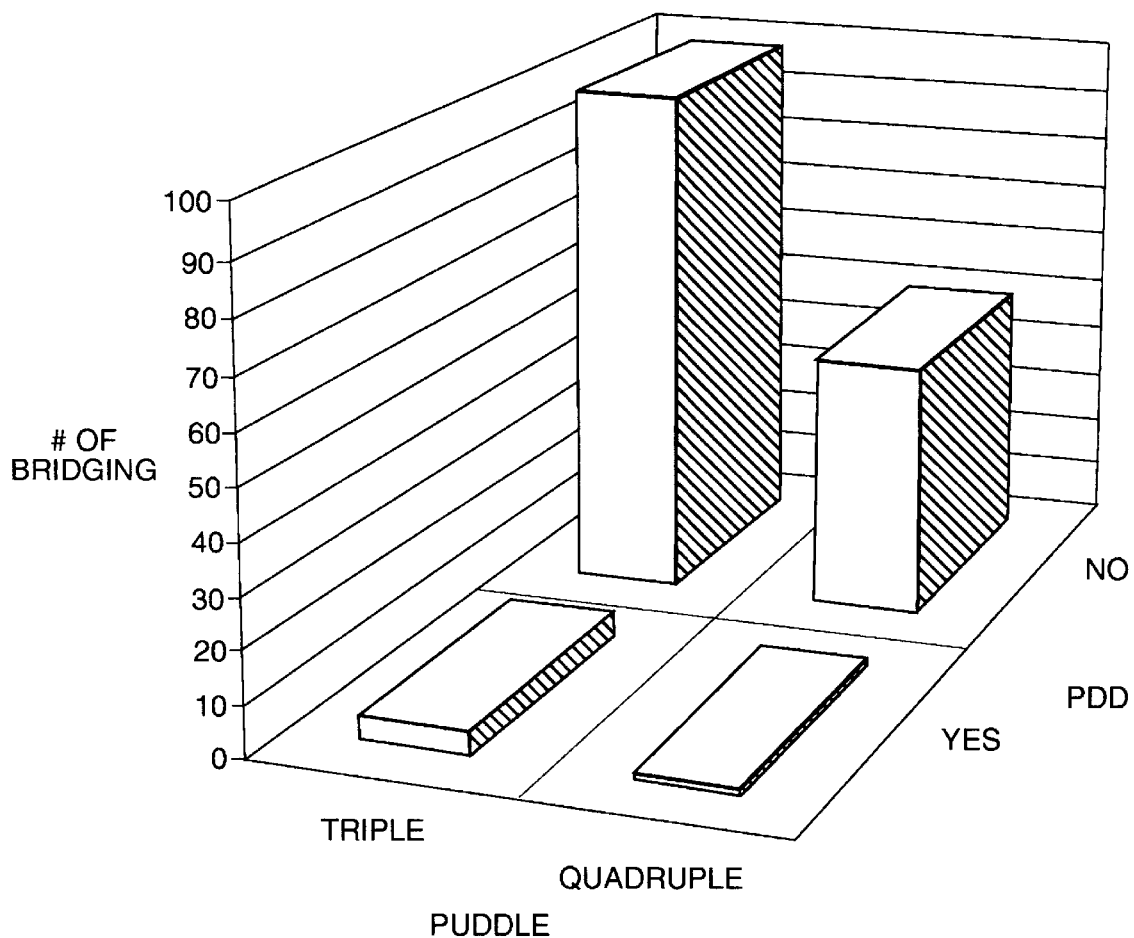
FIG. 5 shows the number of physical defects which occur for resist develop process of the present invention and the conventional resist develop process.

FIG. 5 shows the difference in physical defects between the resist develop process according to the present invention with the PDD and the conventional resist develop process. The number of resist bridging which occur under a developing condition where the developer dispense step and puddle develop step are repeated three times (triple puddle) is shown as is a developing condition where the developer dispense step and puddle develop step are repeated four times (quadruple puddle). The improvement realized by the present invention in the number of physical defects is quantifiably substantial as shown by FIG. 5.

Figure 6:
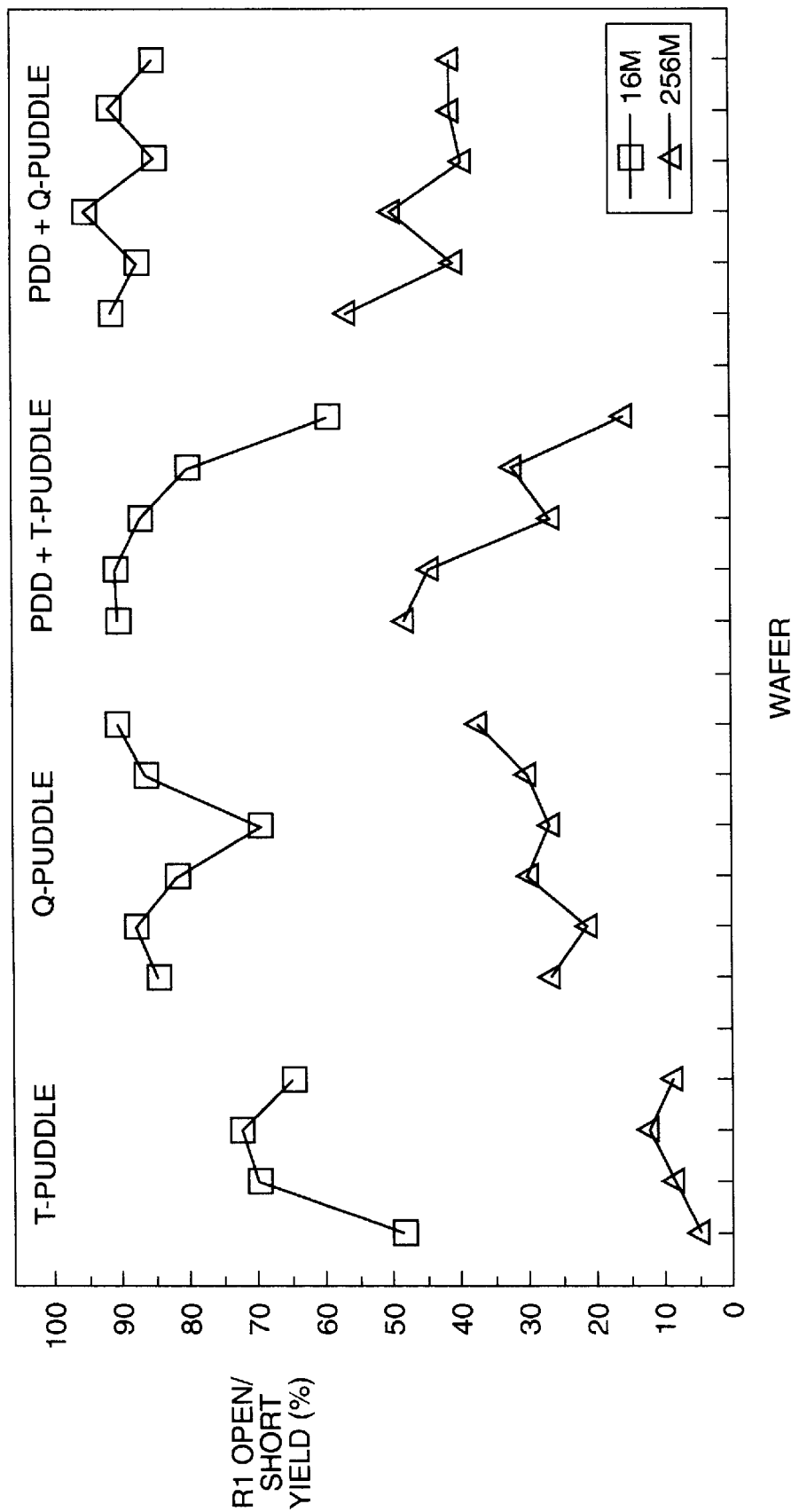
FIG. 6 shows the number of electrical defects which occur for resist develop process of the present invention and a resist develop process that does not employ a post develop dispense step.

To test the electrical effectiveness of the present invention, open and short tests were performed on 0.25 $\mu$m line and space structures whose area corresponds to a 256M DRAM chip. There are 52 chips on an 8-inch wafer. Each chip contains sixteen 16M blocks which form a 256M DRAM when functioning together. For the 256M DRAM to be functional, all of its 16 blocks must be functional. Open and short tests were performed on all 16M blocks. FIG. 6 shows the 16M and 256M yield for both a triple and quadruple puddle using a manufacturing process without the PDD step (T-Puddle and Q-Puddle) and a manufacturing process using the PDD step according to the present invention for both a triple and quadruple puddle (PDD+T-Puddle and PDD+Q-Puddle).

The present invention is particularly advantageous for small line/space arrangements with, for example, gate levels and metal wiring leads, although not limited thereto. Bridging becomes more of a concern as the line/spacing arrangement become increasingly smaller. Thus, the improvement in physical and electrical defects between the present invention and conventional methods is more pronounced with small line/space arrangements.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. A resist develop process for manufacturing a semiconductor device comprising the steps of:
    dispensing a first developer on a semiconductor wafer coated with a resist to form a puddle;
    developing the resist on the wafer surface by dissolving portions of the resist in the first developer;
    spin drying the dissolved portions of the resist; and
    after said step of spin drying, dispensing a second developer onto the wafer surface while rotating the wafer to reduce the concentration of the first developer containing dissolved portions of the resist on the wafer surface without forming another puddle, the second developer replacing the first developer.

2. The resist develop process of claim 1, wherein said step of dispensing the second developer occurs in a period of less than or equal to five seconds.

3. The resist develop process of claim 2, wherein the period is approximately two seconds.

4. The resist develop process of claim 3, wherein approximately twenty-five milliliters of the second developer is dispensed during the period.

5. The resist develop process of claim 1, wherein said step of dispensing the second developer includes dispensing the second developer while the wafer rotates on a wafer chuck at a rate of between 100 and 1000 revolutions per minute.

6. The resist develop process of claim 1, wherein said step of dispensing the second developer includes dispensing the second developer while the wafer rotates on a wafer chuck at a rate of approximately 1000 revolutions per minute.

7. The resist develop process of claim 1, wherein said steps of dispensing the first developer and developing the resist are repeated at least three times prior to said step of dispensing the second developer.

8. The resist develop process of claim 1, wherein said step of spin drying does not completely spin dry the dissolved portions of the resist.

9. The resist develop process of claim 1, wherein the second developer is different from the first developer, but compatible with the wafer and the resist.

10. The resist develop process of claim 1, wherein the second developer contains a different amount of surfactant than the first developer.

11. The resist develop process of claim 1, wherein the first developer and the second developer are the same.

12. The resist develop process of claim 1, wherein the first developer is tetramethylammonium hydroxide (TMAH) and the second developer is tetramethylammonium hydroxide (TMAH) having a different normality than the first developer.

13. The resist develop process of claim 1, wherein the resist is chemically amplified.

14. The resist develop process of claim 1, further comprising the step of rinsing the wafer surface with water after starting said step of dispensing the second developer.

15. The resist develop process of claim 14, wherein said steps of dispensing the second developer and rinsing the wafer surface are approximately simultaneous.

16. The resist develop process of claim 15, wherein said steps of dispensing the second developer and rinsing the wafer surface are performed in immediate succession.

17. The resist develop process of claim 1, wherein said step of dispensing the second developer includes spinning a wafer chuck holding the wafer to remove the first developer with the dissolved portions of the resist.

18. The resist develop process of claim 1, wherein the semiconductor device has line/space structures less than 5 $\mu$m in size.

19. A resist develop process for manufacturing a semiconductor device comprising the steps of:
    dispensing a first developer on a semiconductor wafer coated with a resist to form a puddle;
    developing the resist on the wafer surface by dissolving portions of the resist in the first developer;
    dispensing a second developer onto the wafer surface without forming another puddle while removing the first developer having dissolved portions of the resist by spinning the wafer; and
    repeating the steps of developing and dispensing the first developer prior to performing the step of dispensing the second developer.

20. A resist develop process for manufacturing a semiconductor device comprising the steps of:
    dispensing a first developer on a semiconductor wafer coated with a resist to form a puddle;
    developing the resist on the wafer surface by dissolving portions of the resist in the first developer; and
    dispensing a second developer onto the wafer surface while rotating the wafer to reduce the concentration of the first developer containing dissolved portions of the resist on the wafer surface without forming another puddle, the second developer replacing the first developer, wherein the second developer is different from the first developer, but compatible with the wafer and the resist.

21. A resist develop process for manufacturing a semiconductor device comprising the steps of:
    dispensing a first developer on a semiconductor wafer coated with a resist to form a puddle;
    developing the resist on the wafer surface by dissolving portions of the resist in the first developer; and
    dispensing a second developer onto the wafer surface without forming another puddle while removing the first developer having dissolved portions of the resist by spinning the wafer, wherein the second developer is different from the first developer, but compatible with the wafer and the resist.

* * * * *

UNITED STATES PATENT AND TRADEMARK OFFICE
CERTIFICATE OF CORRECTION

PATENT NO. : 5,897,982
DATED : April 27, 1999
INVENTOR(S) : Tsuyoshi SHIBATA et al.

It is certified that error appears in the above-identified patent and that said Letters Patent is hereby corrected as shown below:

Title page, in the Assignee data, add --International Business Machines Coporation, Armonk, New York--.

Signed and Sealed this

Twenty-eighth Day of December, 1999

Attest:

Q. TODD DICKINSON

Attesting Officer

Acting Commissioner of Patents and Trademarks